(12) United States Patent
Lee

(10) Patent No.: US 7,871,848 B2
(45) Date of Patent: Jan. 18, 2011

(54) SEMICONDUCTOR POWER MODULE PACKAGE WITHOUT TEMPERATURE SENSOR MOUNTED THEREON AND METHOD OF FABRICATING THE SAME

(75) Inventor: Keun-hyuk Lee, Bucheon-si (KR)

(73) Assignee: Fairchild Korea Semiconductor Ltd., Puchon, Kyungki-Do (KR)

( * ) Notice: Subject to any disclaimer, the term of this patent is extended or adjusted under 35 U.S.C. 154(b) by 0 days.

(21) Appl. No.: 12/277,699

(22) Filed: Nov. 25, 2008

(65) Prior Publication Data

US 2009/0140369 A1 Jun. 4, 2009

(30) Foreign Application Priority Data

Nov. 30, 2007 (KR) ............... 10-2007-0123814

(51) Int. Cl.
  *H01L 29/66* (2006.01)
  *H01L 21/50* (2006.01)
(52) U.S. Cl. .......... 438/55; 257/467; 257/723; 257/724; 257/E21.499; 257/E29.347; 438/54
(58) Field of Classification Search ......... 257/467, 257/E29.347, E21.499, 723, 724; 438/54, 438/55
  See application file for complete search history.

(56) References Cited

U.S. PATENT DOCUMENTS

| | | | |
|---|---|---|---|
| 4,497,998 A | 2/1985 | West | |
| 5,066,938 A * | 11/1991 | Kobashi et al. | 338/22 SD |
| 5,763,929 A * | 6/1998 | Iwata | 257/467 |
| 6,060,895 A | 5/2000 | Soh | |
| 6,215,166 B1 * | 4/2001 | McDunn et al. | 257/467 |
| 6,313,598 B1 * | 11/2001 | Tamba et al. | 318/722 |
| 6,449,174 B1 | 9/2002 | Elbanhawy | |
| 6,809,417 B1 | 10/2004 | Rossetti | |
| 2004/0086008 A1 * | 5/2004 | Gregory et al. | 372/34 |
| 2005/0067186 A1 * | 3/2005 | Mizutani et al. | 174/250 |
| 2005/0121701 A1 * | 6/2005 | Hirano et al. | 257/287 |
| 2005/0237033 A1 * | 10/2005 | Shirakawa et al. | 322/28 |
| 2006/0164041 A1 * | 7/2006 | Ooshita et al. | 320/150 |
| 2006/0220180 A1 * | 10/2006 | Takahashi | 257/565 |
| 2008/0224285 A1 | 9/2008 | Lim et al. | |

* cited by examiner

*Primary Examiner*—Wael M Fahmy
*Assistant Examiner*—Peniel M Gumedzoe
(74) *Attorney, Agent, or Firm*—Townsend and Townsend and Crew LLP

(57) ABSTRACT

Provided are a semiconductor power module package and a method of fabricating the same. The semiconductor power module package includes a substrate, semiconductor chips arranged on a top surface of the substrate, and a temperature sensor mounted on a top surface of at least one of the semiconductor chips. The semiconductor chips and the temperature sensor are electrically connected to each other through leads. A sealing material covers the top surface of the substrate, the semiconductor chips, and the temperature sensor except for portions of the leads and a bottom surface of the substrate. The temperature sensor may include a thermistor, and the thermistor may include first and second electrode terminals connected to corresponding leads of the leads. A first wiring pattern may be in contact with the first electrode terminal, and a second wiring pattern may be in contact with the second electrode terminal.

8 Claims, 9 Drawing Sheets

US 7,871,848 B2

SEMICONDUCTOR POWER MODULE PACKAGE WITHOUT TEMPERATURE SENSOR MOUNTED THEREON AND METHOD OF FABRICATING THE SAME

CROSS-REFERENCES TO RELATED APPLICATIONS

This application claims the benefit of Korean Patent Application No. 10-2007-0123814, filed on Nov. 30, 2007, in the Korean Intellectual Property Office, the disclosure of which is incorporated herein in its entirety by reference.

BACKGROUND OF THE INVENTION

1. Field of the Invention

Embodiments of the present invention relate to a semiconductor power module package, and more particularly, to a semiconductor power module package with a temperature sensor mounted thereon and a method of fabricating the semiconductor power module package.

2. Description of the Related Art

When a voltage is applied to a semiconductor chip of a semiconductor package, heat is generated from the semiconductor chip. The heat largely affects the stability and reliability of the semiconductor package. Since a relatively high voltage is applied to a semiconductor power module package, more heat is generated from the semiconductor power module package, and thus the stability and reliability of the semiconductor power module package is more largely affected.

A semiconductor power chip and a semiconductor control chip can be integrated into a semiconductor power module package. Examples of semiconductor power chips and devices include a silicon controlled rectifier (SCR), a power transistor, an insulated-gate bipolar transistor (IGBT), an inverter, and a converter. Unlike low-voltage semiconductor devices such as memory devices, the semiconductor power devices are operated using a high voltage in the range from 30 V to 1000 V or higher which can lead to excessive thermal temperatures. Therefore, the semiconductor power devices need to be securely insulated at a high voltage and have good heat dissipation characteristics. In addition, it is necessary to precisely measure the temperature of a semiconductor power module package for thermally stabilizing the semiconductor power module package.

BRIEF SUMMARY OF THE INVENTION

The present invention provides a semiconductor power module package including a temperature sensor mounted on a semiconductor power chip for directly measuring the temperature of a semiconductor power chip, and a method of fabricating the semiconductor power module package.

According to an aspect of the present invention, there is provided a semiconductor power module package. The semiconductor power module package includes a substrate, at least one semiconductor chip arranged on a top surface of the substrate, a temperature sensor mounted on a top surface of the at least one semiconductor chip, and a lead electrically connected to the temperature sensor.

A sealing material can cover the top surface of the substrate, the semiconductor chips, and the temperature sensor except for portions of the leads and a bottom surface of the substrate. The temperature sensor may include a thermistor, and the thermistor may include first and second electrode terminals connected to corresponding leads of the leads.

A first wiring pattern may be disposed in contact with the first electrode terminal so as to electrically connect the first electrode terminal to one of the corresponding leads. A second wiring pattern may be disposed in contact with the second electrode terminal so as to electrically connect the second electrode terminal to the other one of the corresponding leads. The first and second wiring patterns may be in electric contact with the first and second electrode terminals through solders, respectively. The first and second wiring patterns may include metal patterns such as copper (Cu) patterns.

According to another aspect of the present invention, there is provided a method of fabricating a semiconductor power module package. In the method, a substrate is obtained, and at least one semiconductor chip is placed on a top surface of the substrate. A temperature sensor is mounted on a top surface of the at least one semiconductor chip. A plurality of leads are arranged to be electrically connected to the temperature sensor.

A sealing material can be formed to seal the top surface of the substrate, the semiconductor chips, and the temperature sensor except for portions of the leads and a bottom surface of the substrate. The temperature sensor may be mounted on the top surface of the at least one of the semiconductor chips as follows: an adhesive sheet is attached to the top surface of the at least one of the semiconductor chips; first and second wiring patterns are attached to a top surface of the adhesive sheet; and the first and second wiring patterns are contacted to first and second electrode terminals of the temperature sensor, respectively, through a soldering process so as to electrically connect the first and second electrode terminals to corresponding leads of the leads.

The above general embodiments and other embodiments of the invention are described in the Detailed Description with reference to the Figures. In the Figures, like numerals may reference like elements and descriptions of some elements may not be repeated.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
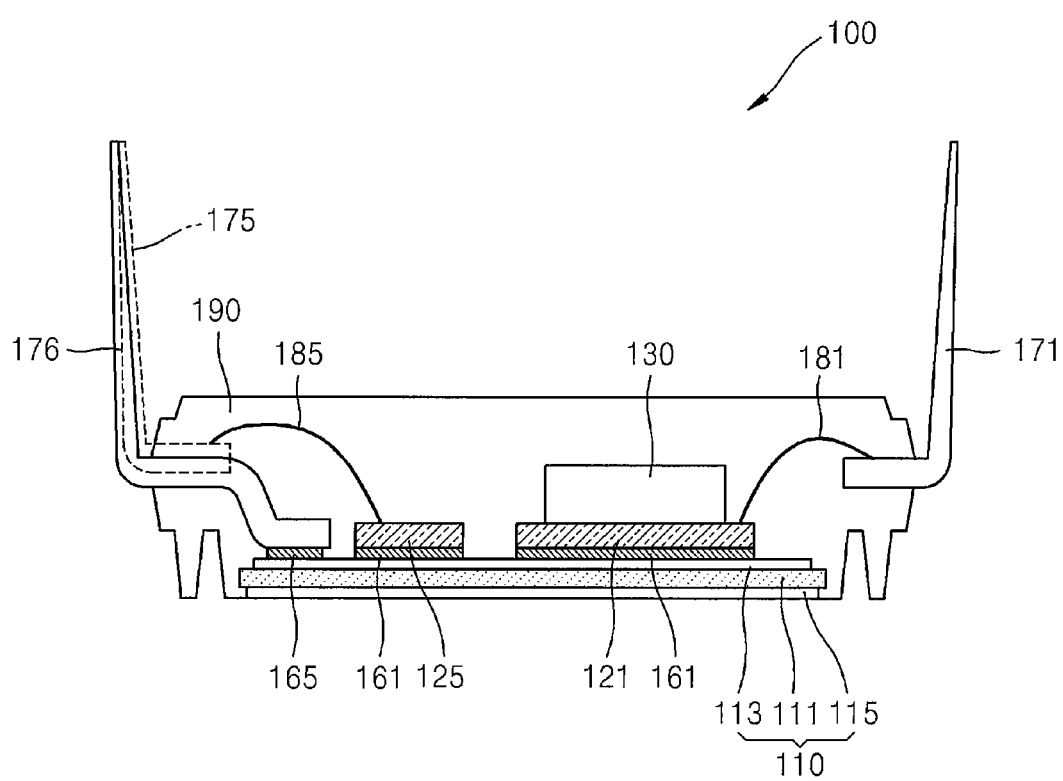
FIG. 1 is a cross-sectional view illustrating a semiconductor power module package according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions may be exaggerated for clarity, and like reference numerals denote like elements.

Figure 2:
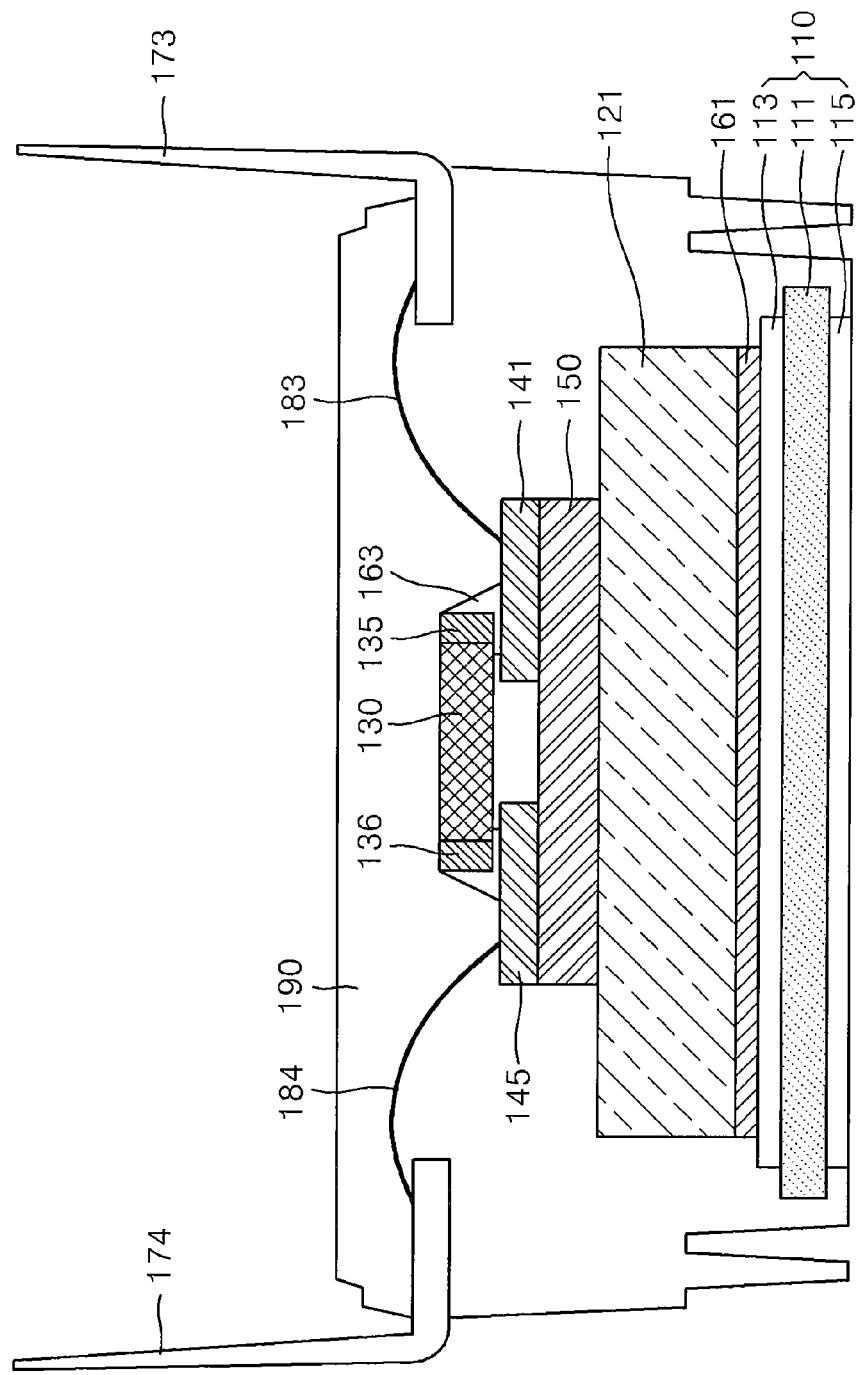
FIG. 2 is a cross-sectional view illustrating portions of the semiconductor power module package of FIG. 1 including a first semiconductor chip and a temperature sensor, according to an embodiment of the present invention.

FIG. 1 is a cross-sectional view illustrating a semiconductor power module package 100 according to an embodiment of the present invention. FIG. 2 is an enlarged cross-sectional view illustrating a portion of the semiconductor power module package 100 of FIG. 1, including a first semiconductor chip 121, a temperature sensor 130, and specific connection leads in a plurality of connection leads, according to an embodiment of the present invention. Other aspects of the package 100 are omitted from FIG. 2 for clarity. Referring to FIGS. 1 and 2, the semiconductor power module package 100 includes a substrate 110. The substrate 110 may include a direct bonding copper (DBC) substrate. The substrate 110 includes a ceramic insulation layer 111, an upper conductive layer 113 disposed on a top surface of the ceramic insulation layer 111, and a lower conductive layer 115 disposed on a bottom surface of the ceramic insulation layer 111.

The ceramic insulation layer 111 may include an $Al_2O_3$ layer, an AlN layer, a $SiO_2$ layer, or BeO layer. The upper conductive layer 113 and the lower conductive layer 115 may include a copper (Cu) layer. The upper conductive layer 113 may include a plurality of conductive patterns 113a (refer to FIGS. 3A and 3B) that are electrically separated. The substrate 110 may comprise an insulated metal substrate (IMS). The IMS may include an Al substrate, an insulation layer such as a polymer layer formed on the Al substrate, and conductive patterns such as copper patterns arranged on the insulation layer.

First and second semiconductor chips 121 and 125 are arranged above the substrate 110. The first and second semiconductor chips 121 and 125 may include a semiconductor power chip. Alternatively, the first and second semiconductor chips 121 and 125 may include a semiconductor power chip and a semiconductor control chip. Solder pads 161 are arranged on the upper conductive layer 113 of the substrate 110, and the first and second semiconductor chips 121 and 125 are arranged on the solder pads 161. The solder pads 161 may be arranged on the conductive patterns 113a of the upper conductive layer 113. The solder pads 161 may include lead (Pb)/tin (Sn), tin(Sn)/silver(Ag), lead (Pb)/tin (Sn)/silver (Ag), or tin (Sn)/silver (Ag)/copper (Cu).

The temperature sensor 130 is disposed on at least one of the first and second semiconductor chips 121 and 125. In the embodiment illustrated in FIG. 1, the temperature sensor 130 is disposed on the first semiconductor chip 121. The temperature sensor 130 may be deposited on the semiconductor power chip of the first and second semiconductor chips 121 and 125. The temperature sensor 130 includes a first electrode terminal 135 and a second electrode terminal 136.

The temperature sensor 130 may comprise a thermistor, which is capable of measuring a change in temperature by a change in resistance. The thermistor may be a negative temperature coefficient (NTC) or positive temperature coefficient (PTC) thermistor. Thermistors according to embodiments of the invention can comprise a semiconductor such as silicon, ceramics, or polymers as is known in the art. In some implementations, the NTC thermistor can comprise a pressed disc or cast chip of a semiconductor such as a sintered metal oxide. In some implementations, the PTC thermistor can comprise a doped polycrystalline ceramic containing barium titanate or other suitable material. In other implementations, the PTC thermistors can comprise a plastic with carbon or other suitable material disbersed throughout. Embodiments of the invention contemplate temperature sensor 130 using a resistance temperature detector comprising a metal such as platinum.

The temperature sensor 130 may be electrically connected to a first wiring pattern 141 and a second wiring pattern 145. The first wiring pattern 141 and the second wiring pattern 145 are wiring patterns used for soldering for the electric connection and wire-bonding between the temperature sensor 130 and corresponding first and second leads 173, 174. The first and second wiring patterns 141 and 145 may include a conductive pattern. The first and second wiring patterns 141 and 145 may comprise a metal such as copper (Cu). The first and second electrode terminals 135 and 136 of the temperature sensor 130 may be electrically connected to the second wiring patterns 141 and 145 through first solders 163, respectively.

The temperature sensor 130 is directly mounted on a top surface of the first semiconductor chip 121 using an adhesive sheet 150. One side of the adhesive sheet 150 is adhered to the first and second wiring patterns 141 and 145, and the other side of the adhesive sheet 150 is adhered to the top surface of the first semiconductor chip 121. The adhesive sheet 150 may comprise an electrically insulating material such as a ceramic or a filled polymer, or may include a separate insulation sheet (not shown) for electrically insulating the first and second wiring patterns 141 and 145 from the semiconductor chip 121. The adhesive sheet 150 may have high thermal conductivity for easily transmitting heat from the semiconductor chip 121 to the temperature sensor 130.

Referring to FIG. 1, The first semiconductor chip 121 may be electrically connected to a first lead 171 through a first wire 181, and fifth lead 176 may be electrically connected to the upper conductive layer 113 (e.g., the conductive pattern 113a) of the substrate 110 through a lead solder 165. The second semiconductor chip 125 may be electrically connected to a second lead 175 (located behind fifth lead 176 in FIG. 1 in certain embodiments, while located in front of fifth lead 176 in alternative embodiments) through a second wire 185. The first semiconductor chip 121 or the second semiconductor chip 125 may be electrically connected to the conductive pattern 113a (refer to FIGS. 3A and 3B) of the upper conductive layer 113 through a wire (not shown).

Referring to FIG. 2, The first wiring pattern 141 may be electrically connected to the third lead 173 through a third wire 183, and the second wiring pattern 145 may be electrically connected to the fourth lead 174 through a fourth wire 184. Therefore, the first electrode terminal 135 of the temperature sensor 130 may be electrically connected to the third lead 173 by means of third wire 183 and first wiring pattern 141. Similarly, the second electrode terminal 136 may be electrically connected to the fourth lead 174 by means of fourth wire 184 and second wiring pattern 145. Thus, the sensor 130 is electrically connected to leads 173 and 174.

Referring to FIGS. 1 and 2, the package can include a sealing material 190 that covers all or portions of the substrate 110, the semiconductor chips 121 and 125, the temperature sensor 130, and the wires 181, 183, 184, and 185. The sealing material 190 may expose portions of the first to fifth leads 171, 175, 173, 174, and 176, and a bottom surface of the lower conductive layer 115. The sealing material 190 may comprise an epoxy molding compound or other suitable material as is known in the art. A heat sink (not shown) may be attached to the exposed bottom surface of the lower conductive layer 115 so as to dissipate heat generated from the semiconductor chips 121 and 125.

Figure 3A:
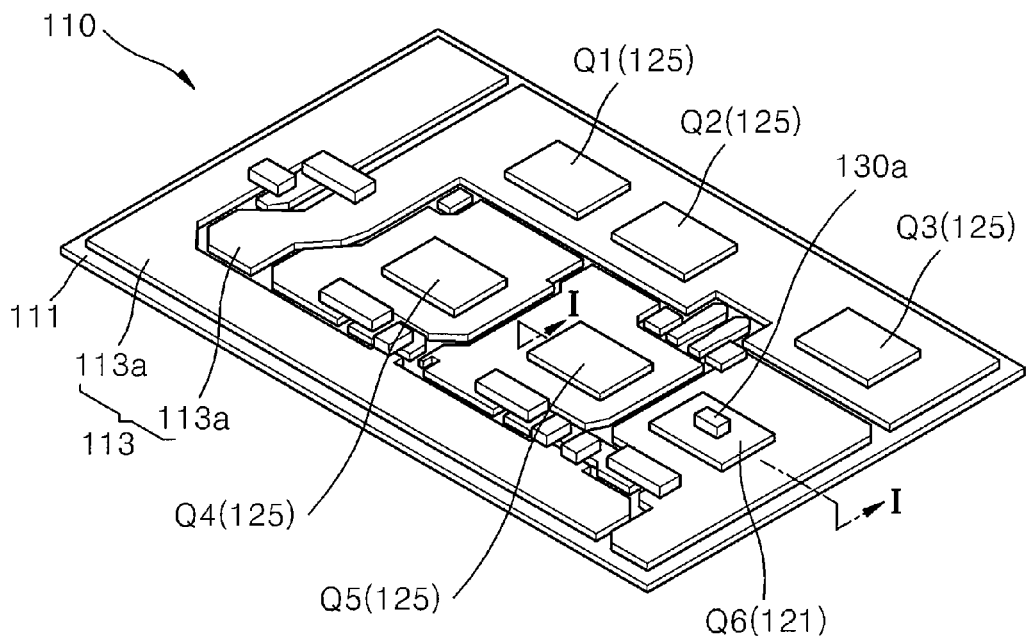
FIGS. 3A and 3B are perspective views illustrating positions of temperature sensors in semiconductor power module packages according to embodiments of the present invention.
Figure 3B:
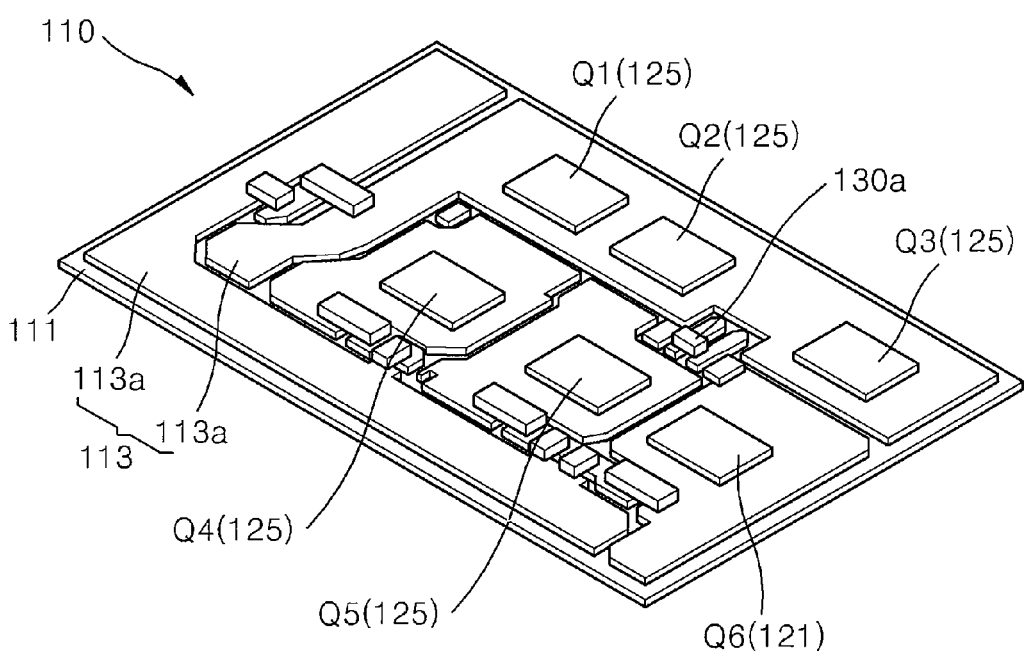

FIGS. 3A and 3B show various possible locations of a temperature sensor 130a mounted on a semiconductor power module package, according to embodiments of the present invention. The sensor 130a will measure various temperatures for the same package, depending on the location of the sensor 130a. Sensor 130a may comprise a thermistor. The sensor 130a corresponds to the temperature sensor 130 depicted in FIGS. 1 and 2. Semiconductor chips 125 and 121 of FIG. 1 correspond to sectional views of semiconductor chips Q6 (121) and Q5 (125) taken along line I-I of FIG. 3A.

Referring to FIGS. 3A and 3B, a substrate 110 includes a ceramic insulation layer 111, an upper conductive layer 113 disposed on a top surface of the ceramic insulation layer 111, and a lower conductive layer (refer to the lower conductive layer 115 of FIG. 1) disposed on a bottom surface of the ceramic insulation layer 111. The upper conductive layer 113 may include a plurality of conductive patterns 113a that are electrically separated from each other. A plurality of semiconductor chips Q1 (125), Q2 (125), Q3 (125), Q4 (125), Q5 (125), and Q6 (121) may be arranged on the conductive patterns 113a.

The sensor 130a may be disposed on at least one of the semiconductor chips Q1 (125), Q2 (125), Q3 (125), Q4 (125), Q5 (125), and Q6 (121). For example, as shown in FIG. 3A, the sensor 130a can be deposited on the semiconductor chip Q6 (121). In certain embodiments, the sensor 130a can be deposited elsewhere in the package. For example, the sensor 130a can be deposited on one of the conductive patterns 113a of the upper conductive layer 113 in the vicinity of the semiconductor chip Q6 (121) as shown in FIG. 3B.

Tables 1 and 2 below show the results of computer simulations of the different temperatures measured by a temperature sensor based upon the sensor location in a semiconductor package. Table 1 below shows simulation results of a temperature that can be sensed through the sensor 130a and temperatures measured from the semiconductor chips Q1 (125), Q2 (125), Q3 (125), Q4 (125), Q5 (125), and Q6 (121) when the sensor 130a is deposited on the semiconductor chip Q6 (121) as in FIG. 3A.

TABLE 1

|  | Semiconductor Chip | | | | | | Temperature sensor |
| --- | --- | --- | --- | --- | --- | --- | --- |
|  | Q1 | Q2 | Q3 | Q4 | Q5 | Q6 | 130a |
| Temperature (° C.) | 129.0 | 129.2 | 129.0 | 168.2 | 168.3 | 168.5 | 161 |

Referring to Table 1, when the temperature of the semiconductor chip Q6 (121) is independently measured to be 168.5° C., the temperature of the sensor 130a is measured to be 161° C. According to the simulation result, the actual temperature measured from the semiconductor chip Q6 (121) can be different from a temperature measured through the sensor 130a by about 7.5° C. (Td1). The temperature difference Td1 may be varied according to the thermal conductivity of an adhesive sheet (refer to the adhesive sheet 150 of FIG. 1) disposed between the sensor 130a and the semiconductor chip Q6 (121). That is, when the sensor 130a is mounted directly on a top surface of the semiconductor chip Q6 (121) (i.e. with only an adhesive sheet and wiring patterns intervening), the temperature of the semiconductor chip Q6 (121) measured through the sensor 130a can approach close to the actual temperature measured from the semiconductor chip Q6 (121) (i.e., Td1 can be minimized).

Table 2 below shows simulation results of a temperature that can be sensed through the sensor 130a and temperatures of the semiconductor chips Q1 (125), Q2 (125), Q3 (125), Q4 (125), Q5 (125), and Q6 (121) when the sensor 130a is deposited on one of the conductive patterns 113a of the upper conductive layer 113 in the vicinity of the semiconductor chip Q6 (121), such as in FIG. 3B.

TABLE 2

|  | Semiconductor Chip | | | | | | Temperature sensor |
| --- | --- | --- | --- | --- | --- | --- | --- |
|  | Q1 | Q2 | Q3 | Q4 | Q5 | Q6 | 130a |
| Temperature (° C.) | 129.0 | 129.2 | 129.0 | 168.2 | 168.3 | 168.5 | 120.7 |

Referring to Table 2, when the temperature of the semiconductor chip Q6 (121) is measured to be 168.5° C., the temperature of the sensor 130a is sensed to be 120.7° C. According to the simulation result, the actual temperature measured from the semiconductor chip Q6 (121) can be different from the temperature sensed through the sensor 130a by about 48.0° C. (Td2). The temperature difference Td2 is much greater than the temperature difference Td1 of the embodiment where the sensor 130a is deposited on the semiconductor chip Q6 (121). Although it is considered that the temperature difference Td1 can increase when the thermal conductivity of the adhesive sheet disposed between the sensor 130a and the semiconductor chip Q6 (121) is lowered, the temperature difference Td2 is still much greater than the temperature difference Td1. Therefore, in embodiments where the sensor 130a is deposited on one of the conductive patterns 113a of the upper conductive layer 113 in the vicinity of the semiconductor chip Q6 (121), it may be more difficult to control the semiconductor power module package using a temperature measured through the sensor 130a.

Comparing the simulation results of placing the temperatures sensor 130a directly on a semiconductor chip (as in Table 1) with placing the temperature sensor laterally spaced from the same semiconductor chip (as in Table 2) demonstrates the advantages of placing the temperature sensor 130a directly on the semiconductor chip Q6 (121). According to the simulation results shown in Tables 1 and 2, it is desirable that the sensor 130a may be deposited on the chosen semiconductor chip, in the plurality of semiconductor chips, that will be temperature-monitored. This can lead to greater accuracy in temperature measurement, and therefore more effective control of the semiconductor package.

FIGS. 4A through 4D are cross-sectional views illustrating a method of fabricating the semiconductor power module package 100 depicted in FIGS. 1 and 2, according to an embodiment of the present invention. In FIGS. 4A through 4D, only a first semiconductor chip 121 and a temperature sensor 130 of the semiconductor power module package 100 are illustrated for clarity, and other aspects of the package are not shown.

Referring to FIGS. 1, 2, and 4A through 4D, a substrate 110 is prepared. The substrate 110 includes a ceramic insulation layer 111, an upper conductive layer 113, and a lower conductive layer 115. The upper conductive layer 113 and the lower conductive layer 115 may be attached to top and bottom surfaces of the ceramic insulation layer 111 by thermal pressing or other suitable means. Solder pads 161 can be formed on predetermined portions of the upper conductive layer 113 by screen printing, and semiconductor chips 121 and 125 are disposed on the solder pads 161 using thermal pressing or other suitable means.

Figure 4A:
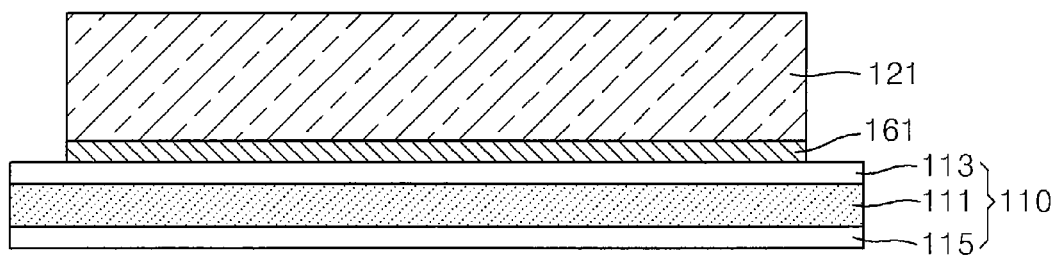
FIGS. 4A through 4D are cross-sectional views illustrating a method of fabricating a semiconductor power module package according to an embodiment of the present invention.
Figure 4B:
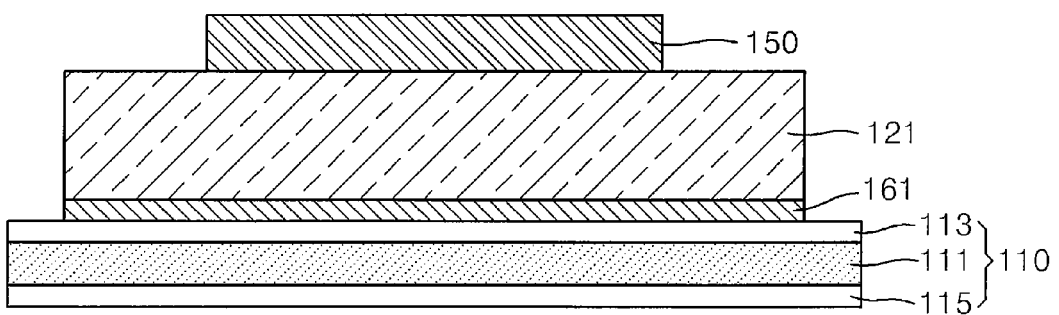
Figure 4C:
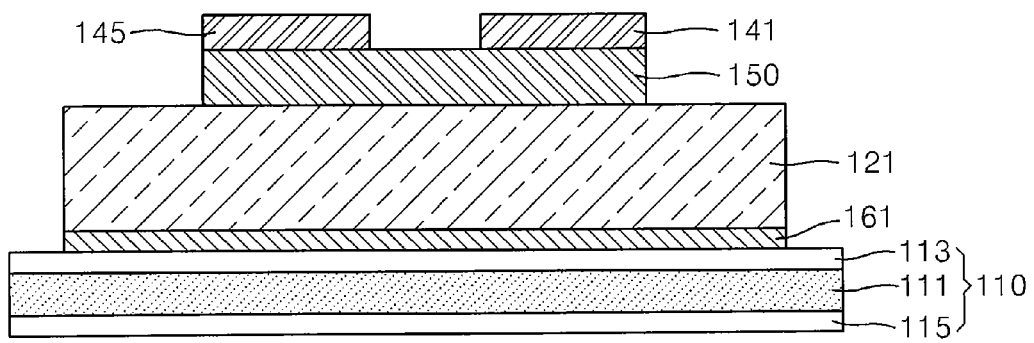

An adhesive sheet 150 is attached to at least one of the semiconductor chips 121 and 125. For example, the adhesive sheet 150 can be attached to the semiconductor chip 121 as shown in FIG. 4B. The adhesive sheet 150 may be attached to a top surface of the semiconductor chip 121 by thermal pressing. A first wiring pattern 141 and a second wiring pattern 145 are attached to the adhesive sheet 150 as shown in FIG. 4C. The first wiring pattern 141 and the second wiring pattern 145 may be attached to the adhesive sheet 150 by thermal pressing or other suitable means. For example, after the first wiring pattern 141 and the second wiring pattern 145 are attached to a first side of the adhesive sheet 150 by thermal pressing, the second side of the adhesive sheet 150 can be attached to the top surface of the semiconductor chip 121. In certain embodiments, a first side of adhesive sheet 150 can be attached to the top surface of semiconductor chip 121, and then the first wiring pattern 141 and the second wiring pattern 145 may be attached to the second side of adhesive sheet 150.

Figure 4D:
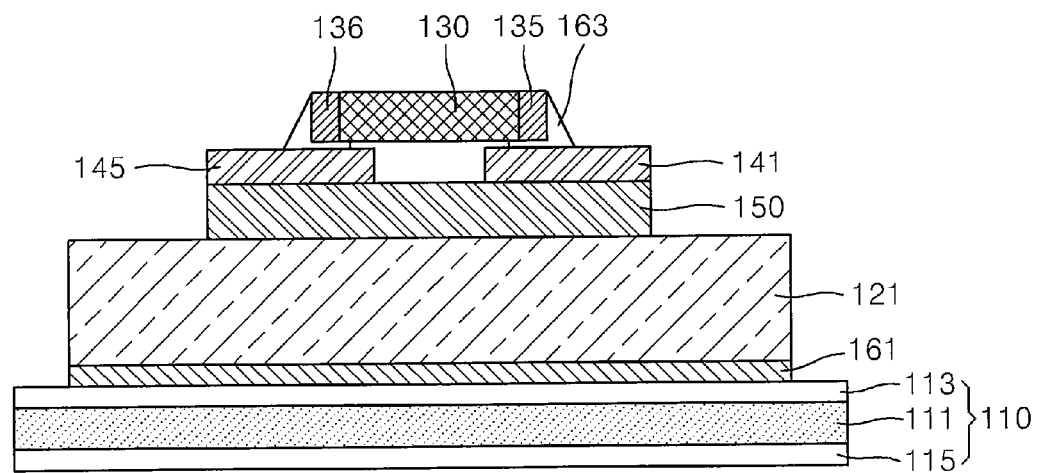

Referring to FIG. 4D, a temperature sensor 130 is mounted on a top surface of at least one semiconductor chip. The temperature sensor 130 is attached to first and second wiring patterns 141, 145. First solders 163 are formed through a soldering process to electrically couple the first and second wiring patterns 141 and 145 to first and second electrode terminals 135 and 136 of the temperature sensor 130, respectively. Thereafter, a fifth lead 176 is electrically connected to the upper conductive layer 113 using a second solder 165 (as shown in FIG. 1). The semiconductor chips 121 and 125 are electrically connected to first and second leads 171 and 175 using first and second wires 181 and 185, and the first and second wiring patterns 141 and 145 are electrically connected to third and fourth leads 173 and 174 using third and fourth wires 183 and 184 through a wire bonding process. Therefore, the first and second electrode terminals 135 and 136 of the temperature sensor 130 can be electrically connected to the third and fourth leads 173 and 174 through the third and fourth wires 183 and 184 (as shown in FIG. 2).

Thereafter, a sealing material 190 is molded on the substrate 110 to cover the semiconductor chips 121 and 125, the wires 181, 183, 184, and 185, and the temperature sensor 130 as shown in FIG. 1. The sealing material 190 exposes portions of the first to fifth leads 171, 175, 173, 174, and 176 and a bottom surface of the lower conductive layer 115. Optionally, a heat sink (not shown) can be attached to the exposed bottom surface of the lower conductive layer 115.

FIGS. 5A through 5D are cross-sectional views illustrating a method of fabricating the semiconductor power module package 100 depicted in FIGS. 1 and 2, according to an embodiment of the present invention. In FIGS. 5A through 5D, only a first semiconductor chip 121 and a temperature sensor 130 of the semiconductor power module package 100 are illustrated for clarity, and other aspects of the package are not shown.

Referring to FIGS. 1, 2, and 5A through 5D, a substrate 110 is prepared. The substrate 110 includes a ceramic insulation layer 111, an upper conductive layer 113, and a lower conductive layer 115. Solder pads 161 can be formed on predetermined portions of the upper conductive layer 113 by screen printing, and semiconductor chips 121 and 125 are disposed on the solder pads 161.

Figure 5A:
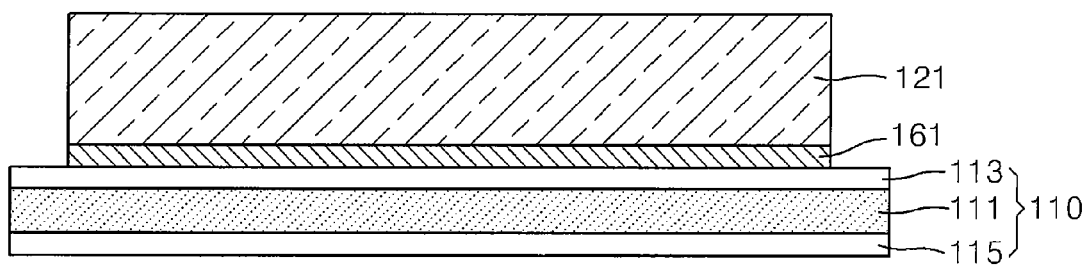
FIGS. 5A through 5D are cross-sectional views illustrating a method of fabricating a semiconductor power module package according to another embodiment of the present invention.
Figure 5B:
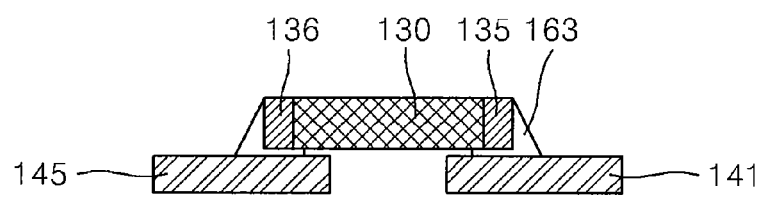

Referring to FIG. 5B, a temperature sensor 130 including first and second electrode terminals 135 and 136 is obtained. The first and second electrode terminals 135 and 136 of the temperature sensor 130 are electrically coupled with first and second wiring patterns 141 and 145 through first solders 163, respectively, which can be formed as is known in the art.

Figure 5C:
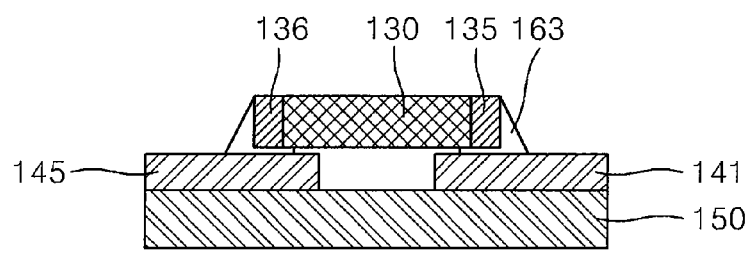
Figure 5D:
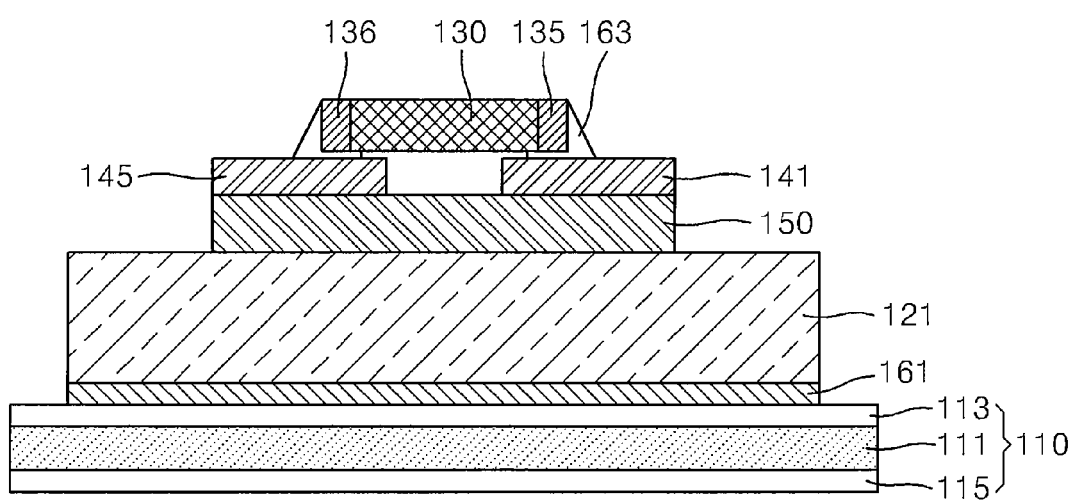

Referring to FIG. 5C, The first wiring pattern 141 and the second wiring pattern 145 are attached to a top surface of an adhesive sheet 150 by suitable means. Then, a temperature sensor 130 is mounted on a top surface of at least one semiconductor chip. The adhesive sheet 150 can be attached to at least one of the semiconductor chips 121 and 125 by suitable means such as thermal pressing. For example, the adhesive sheet 150 can be attached to the semiconductor chip 121 as shown in FIG. 5D. The remaining processes are the same as in the embodiment illustrated in FIGS. 4A through 4D.

FIGS. 6A through 6D are cross-sectional views illustrating a method of fabricating the semiconductor power module package 100 depicted in FIGS. 1 and 2, according to an embodiment of the present invention. In FIGS. 6A through 6D, only a first semiconductor chip 121 and a temperature sensor 130 of the semiconductor power module package 100 are illustrated for clarity, and other aspects of the package are not shown.

Referring to FIGS. 1, 2, and 6A through 6D, a substrate 110 is prepared. The substrate 110 includes a ceramic insulation layer 111, an upper conductive layer 113, and a lower conductive layer 115. Solder pads 161 are formed on predetermined portions of the upper conductive layer 113 by screen printing, and semiconductor chips 121 and 125 are disposed on the solder pads 161 by thermal pressing. A first wiring pattern 141 and a second wiring pattern 145 are attached to a top surface of an adhesive sheet 150.

Figure 6A:
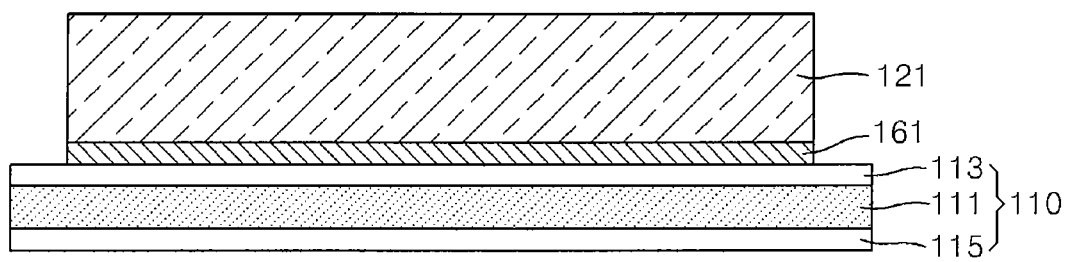
FIGS. 6A through 6D are cross-sectional views illustrating a method of fabricating a semiconductor power module package according to another embodiment of the present invention.
Figure 6B:
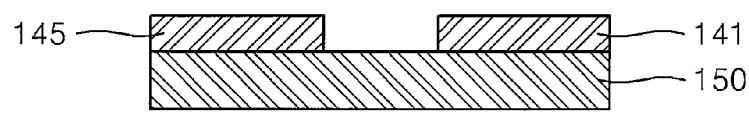
Figure 6C:
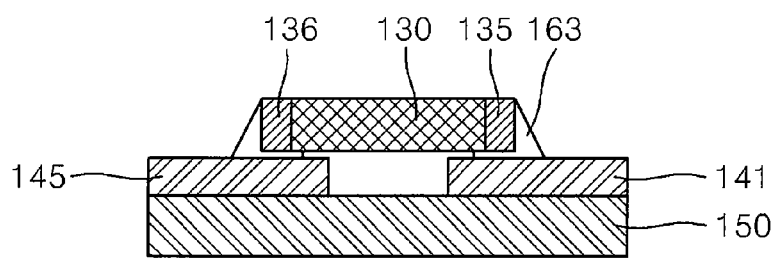
Figure 6D:
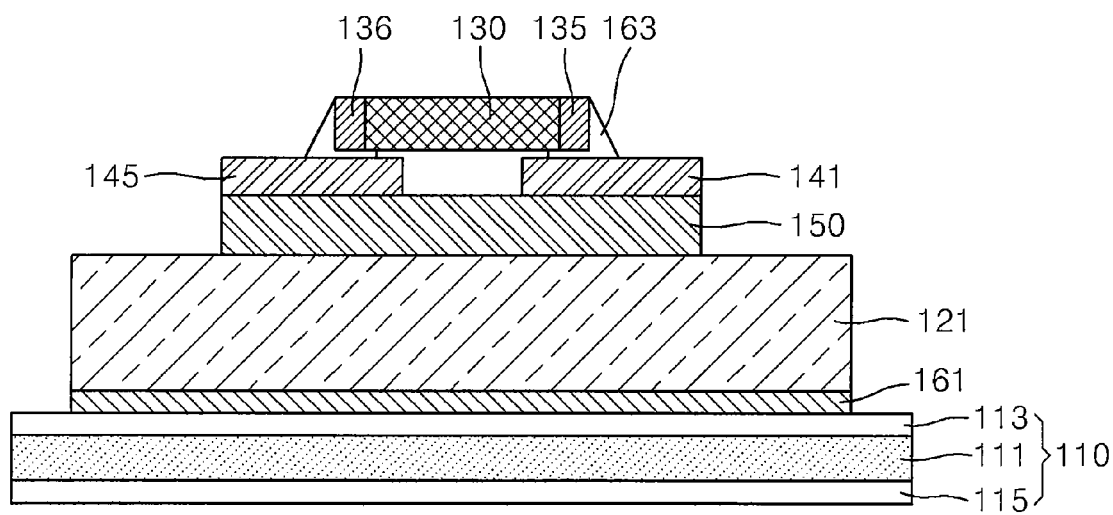

Referring to FIG. 6C-D, a temperature sensor 130 including first and second electrode terminals 135 and 136 is obtained mounted on a top surface of at least one semiconductor chip. The first and second electrode terminals 135 and 136 of the temperature sensor 130 are electrically coupled to the first and second wiring patterns 141 and 145 using first solders 163, respectively. The adhesive sheet 150 is attached to a top surface of at least one of the semiconductor chips 121 and 125. For example, the adhesive sheet 150 can be attached to the top surface of the semiconductor chip 121 as shown in FIG. 6D. The remaining processes are the same as in the embodiment illustrated in FIGS. 4A through 4D.

According to the semiconductor power module package and the method of fabricating the semiconductor power module package in accordance with an embodiment of the present invention, a temperature sensor such as a thermistor is mounted on a top surface of a semiconductor power chip before a sealing material is formed through a molding process. Therefore, as compared with the case where(1) a temperature sensor is mounted laterally spaced from a semiconductor power chip, or (2) mounted on an outer surface of a semiconductor power module package after the package is molded, the temperature of the semiconductor power chip can be quickly and precisely measured. Thus, for example, when the semiconductor power chip is reaches a high temperature, power to the semiconductor power module package can be immediately cut off to protect the semiconductor power module package. In contrast, a temperature sensor not directly on the chip (such as located outside the sealing material) will be slower to register temperature changes, and there is a greater chance of damage to the package.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor power module package, the method comprising:
    obtaining a substrate comprising a ceramic insulation layer, an upper conductive layer disposed on a top surface of the ceramic insulation layer, and a lower conductive layer deposited on a bottom surface of the ceramic insulation layer;
    placing at least one semiconductor chip on a top surface of the substrate;
    mounting a temperature sensor on a top surface of the at least one semiconductor chip, wherein the temperature sensor comprises a thermistor; and
    arranging a plurality of leads to be electrically connected to the temperature sensor,
    wherein the mounting of the temperature sensor includes attaching an adhesive sheet to the top surface of the at least one semiconductor chip,
    attaching first and second wiring patterns to a top surface of the adhesive sheet, and
    coupling the first wiring pattern to a first electrode terminal of the temperature sensor and coupling the second wiring pattern to a second electrode terminal of the temperature sensor, through a soldering process so as to electrically connect the first and second electrode terminals to corresponding leads in the plurality of leads.

2. The method of claim 1, further comprising:
    forming a sealing material to seal the top surface of the substrate, the at least one semiconductor chip, and the temperature sensor except for portions of the plurality of leads and a bottom surface of the substrate.

3. The method of claim 1, wherein the placing the at least one semiconductor chip comprises thermally pressing the at least one semiconductor chip onto the top surface of the substrate.

4. The method of claim 3, further comprising forming solder pads on the top surface of the substrate by screen printing prior to the placing the at least one semiconductor chip.

5. A method of fabricating a semiconductor power module package, the method comprising:
    obtaining a substrate comprising a ceramic insulation layer, an upper conductive layer disposed on a top surface of the ceramic insulation layer, and a lower conductive layer deposited on a bottom surface of the ceramic insulation layer;
    placing at least one semiconductor chip on a top surface of the substrate;
    mounting a temperature sensor on a top surface of the at least one semiconductor chip, wherein the temperature sensor comprises a thermistor; and
    arranging a plurality of leads to be electrically connected to the temperature sensor, wherein the mounting of the temperature sensor comprises
    attaching first and second wiring patterns to a top surface of an adhesive sheet;
    coupling the first wiring pattern to a first electrode terminal of the temperature sensor and coupling the second wiring pattern to a second electrode terminal of the temperature sensor, through a soldering process so as to electrically connect the first and second electrode terminals to corresponding leads in the plurality of leads; and
    attaching the adhesive sheet to a top surface of the at least one semiconductor chip.

6. A method of fabricating a semiconductor power module package, the method comprising:
    obtaining a substrate comprising a ceramic insulation layer, an upper conductive layer disposed on a top surface of the ceramic insulation layer, and a lower conductive layer deposited on a bottom surface of the ceramic insulation layer;
    placing at least one semiconductor chip on a top surface of the substrate;
    mounting a temperature sensor on a top surface of the at least one semiconductor chip, wherein the temperature sensor comprises a thermistor; and
    arranging a plurality of leads to be electrically connected to the temperature sensor, wherein the mounting of the temperature sensor comprises
    obtaining first and second wiring patterns, wherein the temperature sensor comprises first and second electrode terminals;
    coupling the first wiring pattern to a first electrode terminal of the temperature sensor and coupling the second wiring pattern to a second electrode terminal of the temperature sensor, through a soldering process so as to electrically connect the first and second electrode terminals to corresponding leads in the plurality of leads;
    attaching the first wiring pattern, the second wiring pattern, and the temperature sensor to a top surface of an adhesive sheet; and
    attaching the adhesive sheet to the top surface of the at least one semiconductor chip.

7. The method of claim 1, further comprising electrically connecting the at least one semiconductor chip to a lead in the plurality of leads.

8. The method of claim 1, wherein the upper conductive layer comprises five electrically separated conductive patterns, wherein a separate semiconductor chip is arranged on each electrically separated conductive pattern.

* * * * *

UNITED STATES PATENT AND TRADEMARK OFFICE
CERTIFICATE OF CORRECTION

| | | |
|---|---|---|
| PATENT NO. | : 7,871,848 B2 | Page 1 of 1 |
| APPLICATION NO. | : 12/277699 | |
| DATED | : January 18, 2011 | |
| INVENTOR(S) | : Keun-hyuk Lee | |

It is certified that error appears in the above-identified patent and that said Letters Patent is hereby corrected as shown below:

On the Title Page, item (54) and at column 1, lines 1 through 4, please correct the Title of the Invention as follows:

Change "SEMICONDUCTOR POWER MODULE PACKAGE WITHOUT TEMPERATURE SENSOR MOUNTED THEREON AND METHOD OF FABRICATING THE SAME"

To --SEMICONDUCTOR POWER MODULE PACKAGE WITH TEMPERATURE SENSOR MOUNTED THEREON AND METHOD OF FABRICATING THE SAME--.

Signed and Sealed this
Fifth Day of April, 2011

David J. Kappos
*Director of the United States Patent and Trademark Office*